United States Patent [19]
Olnowich et al.

[11] Patent Number: 5,654,695
[45] Date of Patent: Aug. 5, 1997

[54] MULTI-FUNCTION NETWORK

[75] Inventors: Howard Thomas Olnowich, Endwell; Thomas Norman Barker, Vestal; Peter Anthony Franaszek, Katonah; Philip Heidelberger, Peekskill; Bharat Deep Rathi, Mahopac, all of N.Y.; Anujan Mangala Varma, Santa Cruz, Calif.

[73] Assignee: International Business Machines Corporation, Armonk, N.Y.

[21] Appl. No.: 606,232

[22] Filed: Feb. 23, 1996

Related U.S. Application Data

[63] Continuation of Ser. No. 216,789, Mar. 23, 1994, abandoned, which is a continuation of Ser. No. 799,497, Nov. 27, 1991, abandoned, which is a continuation-in-part of Ser. No. 659,199, Feb. 22, 1991, abandoned, and a continuation-in-part of Ser. No. 677,543, Mar. 29, 1991, abandoned, and a continuation-in-part of Ser. No. 748,316, Aug. 21, 1991, Pat. No. 5,404,461, and a continuation-in-part of Ser. No. 748,302, Aug. 21, 1991, and a continuation-in-part of Ser. No. 748,303, Aug. 21, 1991, Pat. No. 5,365,228, and a continuation-in-part of Ser. No. 748,295, Aug. 21, 1991, Pat. No. 5,250,943.

[51] Int. Cl.$^6$ .................................................. H04Q 1/00
[52] U.S. Cl. .................. 340/825.01; 340/827; 340/825.8
[58] Field of Search ........................ 340/825.01, 825.03, 340/826, 827, 825.79, 825.8, 825.85, 825.86, 825.87; 370/16, 54, 60.1, 58.1; 395/200.02, 200.15, 182.02, 311

[56] References Cited

U.S. PATENT DOCUMENTS

| | | | |
|---|---|---|---|
| 3,129,407 | 4/1964 | Paull | 340/827 |
| 4,207,609 | 6/1980 | Luiz et al. | 364/200 |
| 4,396,984 | 8/1983 | Videki, II | 364/200 |
| 4,417,245 | 11/1983 | Melas et al. | 340/827 |
| 4,417,249 | 11/1983 | Melas | 340/825.8 |
| 4,455,605 | 6/1984 | Cormier et al. | 364/200 |
| 4,570,261 | 2/1986 | Maher | 371/16 |
| 4,654,842 | 3/1987 | Coraluppi et al. | 370/16 |
| 4,733,391 | 3/1988 | Godbold et al. | 370/88 |
| 4,754,395 | 6/1988 | Weisshaar et al. | 364/200 |
| 4,811,201 | 3/1989 | Rau et al. | 364/200 |

(List continued on next page.)

FOREIGN PATENT DOCUMENTS

| | | |
|---|---|---|
| 8700373 | 1/1987 | WIPO. |
| 8702155 | 4/1987 | WIPO. |

OTHER PUBLICATIONS

IBM TDB vol. 33, No. 5, Oct., 1990, "Asynchronous Digital Video Switching System", by Farrell et al, pp. 227–233.
IBM Technical Disclosure Bulletin, vol. 32, No. 7, Dec. 1989, "Reverse Bit Routing For Hierarchical Multistage Interconnection Networks", published anonymously.
IBM Technical Disclosure Bulletin, vol. 34, No. 8, Jan. 1992, "XNL Switch And Its Control", published anonymously.
Real–Time Systems Symposium, Dec. 1988, "Support For High–Priority Traffic In VLSI Communication Switches", pp. 191–200, by Tamir et al.
Journal of Research & Development by P. A. Franaszek vol. 31 No. 1–1987 'Path Hierarchies in Interconnect . . . ".
Journal of Research & Development by P. Heidelberger vol. 35 No. 1/2 Jan./Mar. 1991 "Traffic Studies of . . . ".

*Primary Examiner*—Edwin C. Holloway, III
*Attorney, Agent, or Firm*—Michele A. Mobley; Jenkens & Gilchrist

[57] ABSTRACT

A multi-stage architecture for providing a single switching component in multiplicity to create a single network capable of performing a multiplicity of functions. One function of the disclosed network is to circumvent the traditional blocking problems in multi-stage networks by implementing ALTERNATE PATHS between devices within the same network. This permits a non-blocked path between 2 devices to be found by rearrangeability—the act of trying or searching different alternate paths until a non-blocked connection is established. A second network function permits a special high priority mode of transfer which will guarantee that the connection will be made to an idle device as rapidly as possible.

4 Claims, 4 Drawing Sheets

U.S. PATENT DOCUMENTS

| | | | |
|---|---|---|---|
| 4,873,517 | 10/1989 | Baratz et al. | 340/825 |
| 4,914,571 | 4/1990 | Baratz et al. | 364/200 |
| 4,932,021 | 6/1990 | Moody | 370/54 |
| 4,952,930 | 8/1990 | Franaszek et al. | 340/825.8 |
| 4,965,788 | 10/1990 | Newman . | |
| 4,983,961 | 1/1991 | Brunle et al. | 340/826 |
| 4,991,204 | 2/1991 | Yamamoto et al. | 340/827 |
| 5,084,867 | 1/1992 | Tachibana et al. | 320/54 |
| 5,123,011 | 6/1992 | Hein et al. | 370/58.1 |

MULTI-FUNCTION NETWORK

CROSS REFERENCE TO RELATED APPLICATIONS

The present patent application is a continuation of U.S. Ser. No. 08/216,789, filed Mar. 23, 1994, now abandoned, which was a continuation of U.S. Ser. No. 07/799,497, filed Nov. 27, 1991, now abandoned, which also claims priority and is a continuation-in-part of the following related co-pending patent applications.

"Asynchronous Low Latency Data Recovery Apparatus and Method", Betts et al, U.S. Ser. No. 07/659,199, filed Feb. 22, 1991; abandoned in favor of Ser. No. 08/089,056, filed Jul. 8, 1993; and abandoned in favor of Ser. No. 08/407,928 filed Mar. 21, 1995, and allowed, but not yet issued;

"All-Node Switch, An Unclocked, Unbuffered Asynchronous Switching Apparatus" by P. A. Franasek et al, U.S. Ser. No. 07/677,543; filed Mar. 29, 1991; abandoned in favor of Ser. No. 08/143,977 filed Oct. 27, 1993; and abandoned in favor of Ser. No. 08/457, 789 filed Jun. 2, 1995;

"Broadcast/Switching Apparatus For Executing Broadcast/Multi-Cast" by H. T. Olnowich et al, U.S. Ser. No. 07/748,316, filed Aug. 21, 1991; now issued as U.S. Pat. No. 5,404,461;

"Multi-Sender/Switching Apparatus For Status Reporting Over Unbuffered Asynchronous Multi-Stage Networks" by H. T. Olnowich et al, U.S. Ser. No. 07/748,302, filed Aug. 21, 1991;

"Sync-Net—A Barrier Synchronization Apparatus For Multi-Stage Networks" by P. L. Childs et al, U.S. Ser. No. 07/748,303, filed Aug. 21, 1991; now issued as U.S. Pat. No. 5,365,228;

"GVT-Net—A Global Virtual Time Calculation Apparatus For Multi-Stage Networks" by P. L. Childs et al, U.S. Ser. No. 07/748,295, filed Aug. 21, 1991; now issued as U.S. Pat. No. 5,250,943;

In addition, me following applications which were filed concurrently with the predecessor to this application, U.S. Ser. No. 07/799,497:

"Priority Broadcast and Multi-Cast For Unbuffered Multi-Stage Networks" by H. T. Olnowich et al, U.S. Ser. No. 07/799,262, filed Nov. 27, 1991; abandoned in favor of U.S. Ser. No. 08/318,578, filed Oct. 5, 1994;

"Dual Priority Switching Apparatus for Simplex Networks" by P. Kogge et al, U.S. Ser. No. 07/800,652, filed Nov. 27, 1991; and now issued as U.S. Pat. No. 5,444,705;

"Multi-Media Serial Line Switching Adapter For Parallel Networks and Heterogeneous and Homologous Computer System", by H. T. Olnowich et al, U.S. Ser. No. 07/799,602, filed Nov. 27, 1991; abandoned in favor of U.S. Ser. No. 08/390,893, filed Feb. 15, 1995, allowed Jan. 4, 1996; and divided into (1) U.S. Ser. No. 08/178,957, filed Jan. 7, 1994, abandoned in favor of U.S. Ser. No. 08/521,774 filed Aug. 31, 1995, and (2) 08/178,974, filed Jan. 7, 1994.

These co-pending applications, issued patents, and the present application are owned by one and the same assignee, namely, International Business Machines Corporation of Armonk, N.Y.

The descriptions set forth in these copending applications are hereby incorporated into the present application by this reference.

FIELD OF THE INVENTION

The inventions relate to multi-function networks, and particularly to a multi-function network which can operate as a multi-stage asynchronous network.

BACKGROUND OF THE INVENTIONS

Multi-stage Switching Networks have become an accepted means for interconnecting multiple devices within a computer system. Often systems require multiple paths through the switching networks to perform different functions. An earlier work at IBM by Peter Franaszek, as described in his work entitled "Path Hierarchies in Interconnection Networks" described two hierarchical paths for a network, one providing low-latency message transfer and the other providing guaranteed-delivery of a message transfer and the other providing guaranteed-delivery of a message at a longer latency. A message is attempted over the low-latency path first. If the transmission fails due to blocking or contention, it is retransmitted over the guaranteed-delivery path. This allows usually about 90% of the messages to be sent successfully over the low-latency path, and guarantees the delivery of a message that gets blocked on the low-latency path due to retransmissions.

U.S. Pat. No. 4,952,930 to P. A. Franaszek et al. issued Aug. 28, 1990 described the approach which used a second buffered path, which is in some ways similar to the current approach. However, it suffered by its requirements of a plurality of switches to implement it. While there would be no impediment to our adopting the teachings of this patent there remained a need for a simpler and yet more flexible approach to create a multi-stage network.

Multi-stage networks have become an accepted means for interconnecting multiple devices within a computer system. They are a replacement for the traditional crossbar interconnection. The crossbar is still a most efficient method of network interconnection, but it tends to be impractical for large systems. An N×M crossbar permits total simultaneous interconnection, where all the N devices can be communicating simultaneously with different members of the set of M devices. The crossbar is "non-blocking" because there nothing internal to the crossbar which prevents any given N device from connecting to an M device which is IDLE (is not connected to some other N device). If an N device desires to connect to an M device which is BUSY (previously connected to some other N device), no connection can be made until the previous connection is broken—however, this is referred to as "contention" and is not called "blocking".

When N and M become large (usually greater than 32 or 64) it becomes very unwieldy to build crossbars since their complexity increases at an N×M rate and their pin count increases at an (N×M)×W rate, where W=the number of pins per port. Thus large networks are usually built from multi-stage networks constructed by cascading several stages of smaller crossbars together to provide an expanded network. The disadvantage of multi-stage networks is that they are "blocking", i.e., a connection might not be able to be made to an IDLE M device because there is no path available in the network to provide the necessary connection to the IDLE device.

Among other patents which might be reviewed are: U.S. Pat. No. 4,914,571 to A. E. Baratz et al. issued Apr. 3, 1990 which describes a method of addressing and thus how to find resources attached to a network, but does not deal with the hardware for the actual network itself.

U.S. Pat. No. 4,455,605 to R. L. Cormier et al. issued Jun. 19, 1984 which is for a bus oriented system, it is not a multi-stage network. Similarly, U.S. Pat. No. 4,396,984 to E. R. Videki, II issued Aug. 2, 1983 is for an I/O bus channel, not a multi-stage network. U.S. Pat. No. 4,570,261 to J. W. Maher issued Feb. 11, 1986 is for fault recovery over a bus oriented system, not a multi-stage network.

U.S. Pat. No. 4,207,609 to F. A. Luiz et al. issued Jun. 10, 1980 illustrates an I/O bus channel so that those in the art will understand the differences between the subject matter. It is not a multi-stage network.

U.S. Pat. No. 4,873,517 to A. E. Baratz et al. issued Oct. 10, 1989 is for a totally different type of network, not an equi-distant multi-stage network like that which we will describe, and also, U.S. Pat. No. 4,932,021 to T. S. Moody issued Jun. 5, 1990 for bus wiring paths inside a computer box, it is not a multi-stage network. U.S. Pat. No. 4,733,391 to R. J. Godbold et al. issued Mar. 22, 1988 illustrates a ring interconnection network, which is unlike a multi-stage network. U.S. Pat. No. 4,811,201 to B. R. Rau et al. issued Mar. 7, 1989 are not applicable to a multi-stage network. U.S. Pat. No. 4,754,395 to B. P Weisshaar et al. issued Jun. 28, 1988 is for a ring interconnection network.

We have solved some of the problems encountered in the prior art and will describe a way whereby some of the traditional blocking problems in multi-stage networks are circumvented.

SUMMARY OF THE INVENTIONS

The traditional blocking problems in multi-stage networks is circumvented by implementing ALTERNATE PATHS between all N and M devices within the same network. This permits a non-blocked path between 2 devices to be found by "rearrangeability"—The act of trying or searching different alternate paths until a non-blocked connection is established. It also permits some of the ALTERNATE PATHS to be used for GUARANTEED DELIVERY—a special high priority mode of transfer which will guarantee that the connection will be made to an IDLE device as rapidly as possible. In addition, the ALTERNATE PATHS provide a much more fault tolerant network than provided by state-of-the-art solutions.

As a result of our inventions we provide a single, unidirectional, unbuffered, multi-stage network capable of doing the total network job consisting of multiple functions. The functional complexity provided usually requires four or more state-of-the-art multi-stage networks to perform the equivalent job. The single network disclosed here allows traffic in both directions, provides for non-blocking via ALTERNATE PATHS and REARRANGEABILITY, incorporates GUARANTEED DELIVERY and FAULT TOLERANCE, and yet is very compact and inexpensive to implement. In addition, the network is modular in nature and permits easy adaptation to any sized system.

We will describe in the following detailed inventions further features and improvements. A reader may wish to obtain further background by reading the features and improvements of the related applications referenced above which are hereby included by reference. References in the following detailed description refer to the drawings which are provided herewith.

BRIEF DESCRIPTION OF THE DRAWINGS

FIG. 2, is composed of two parts, wherein

FIG. 3 has two parts, wherein

FIG. 4 has two parts, wherein

DETAILED DESCRIPTION OF THE INVENTIONS

Before turning to the drawings, it should be noted that the ALL-NODE switch described in the related applications is applicable to the present inventions. The switch first described in U.S. Ser. No. 07/677,543, abandoned in favor of Ser. No. 08/143,977, filed Oct. 27, 1993, abandoned in favor of Ser. No. 08/457,789, filed Jun. 2, 1995, may be an 8×8 switch as well as a 4×4 switch as there described, as will appreciated by those skilled in the art. In such a switch the four data lines would be replicated and increased to eight data lines while the other features of the inventions are present.

The preferred switch thus is an Asynchronous, Low Latency inter Node crossbar switch which is self routing in two cycle times at the same high speed serial rate that that is transferred through the switch. The normal mode of the switch should require no synchronization means among any of its input and output ports which interface to the switch. The switch is completely void of centrally controlled clocking and data buffering. Data which traverses the switch should only encounter three gate delays, an on chip receiver, a multiplexer, and an off chip driver. Contention will be detected and resolved on the chip, and the logic implementation, as described in the related applications is simple and low in gate count. Such a switch will comprise for a node of a network a plurality of input and output ports, and a connection control circuit for each input port, and a multiplexer control circuit for each output port for connecting any of I inputs to any of Z outputs, where I and Z can assume any unique value greater than or equal to two.

DETAILED DESCRIPTION OF THE PREFERRED EMBODIMENTS

Figure 1:
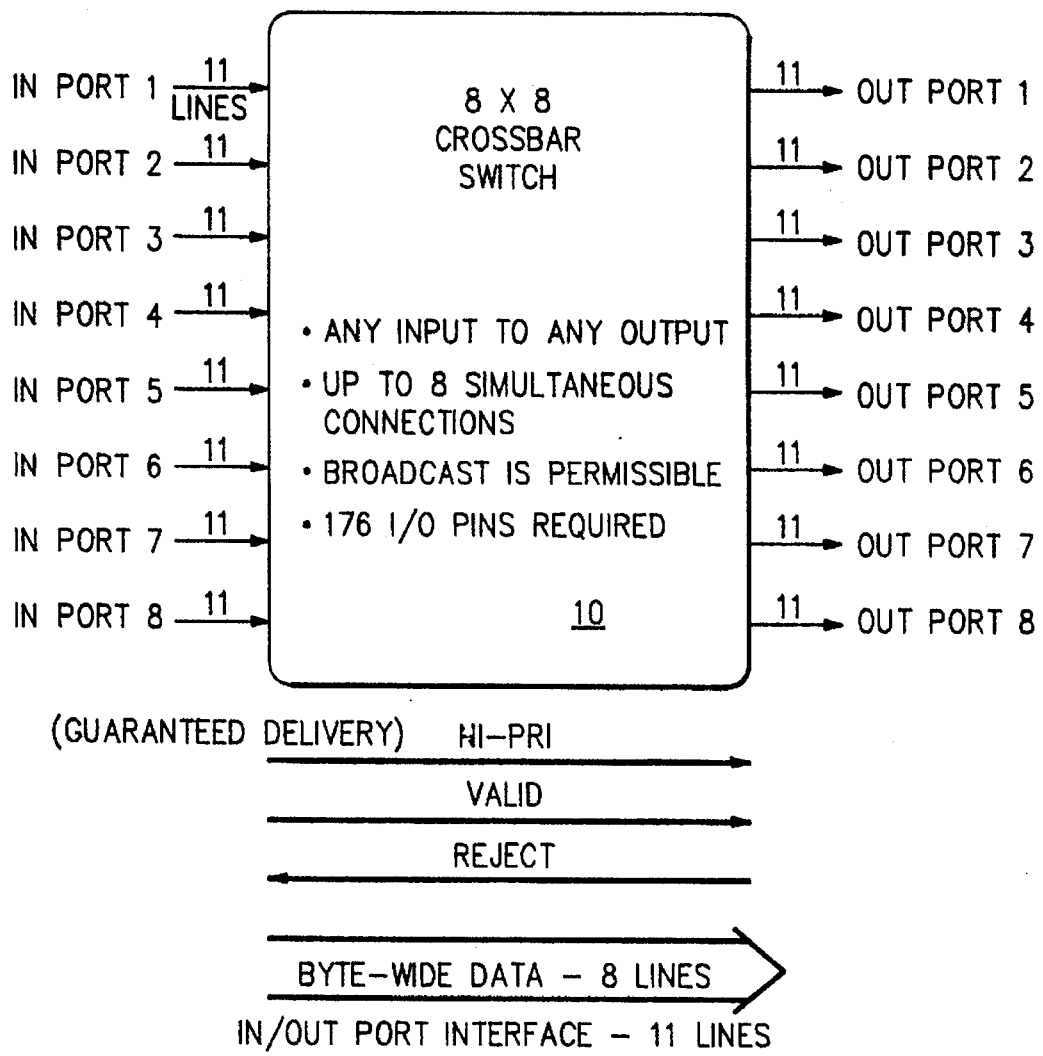
FIG. 1 illustrates a basic element of the network, which as a preferred embodiment is chosen to be an 8×8 crossbar switch as illustrated.

With this background, we turn now to the drawings which illustrate the inventions described here in greater detail. It may be seen that the basic element for the construction of the multi-stage network is chosen here to be an 8×8 crossbar switch 10 as shown in FIG. 1. This 8×8 crossbar switch need not be identical to the ALL-NODE unidirectional switch in order to implement the claimed invention, but that would be our preferred mode of implementation, as described further.

The switch is unidirectional in that it accepts inputs from eight different sources and can connect them to any of eight different destinations. It is capable of supporting eight interconnections simultaneously. The output ports from one crossbar switch can be connected to input ports of other crossbar Switches in a cascading fashion to provide multi-stage networks which are larger than 8×8. The data lines 11 are by the switch 10 connected, allowing any input to pass data on line 11 to any output. With eight data lines, up to eight simultaneous connections can be made. Broadcast is permissible, and the broadcast of the related applications is the preferred mode. Guaranteed delivery is provided by the HI-PRI, VALID and REJECT controls, in accordance with the application filed concurrently herewith, U.S. Ser. No. 07/800,652, U.S. Pat. No. 5,444, being the best mode.

Figure 2A:
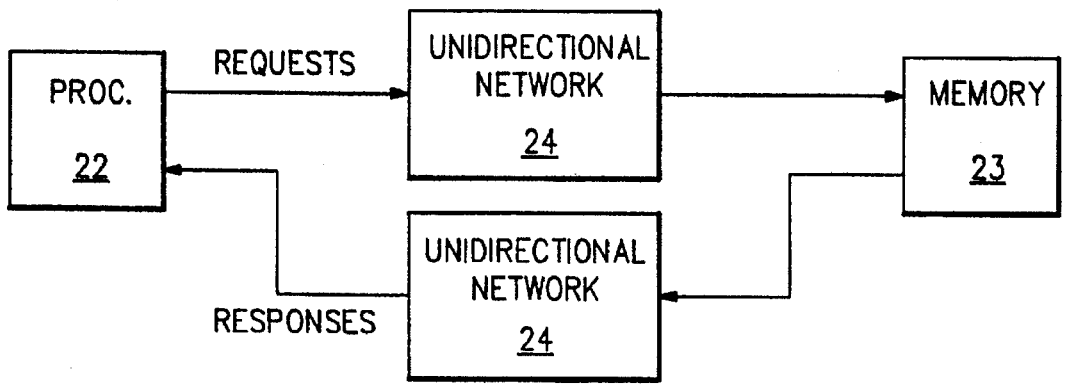
FIG. 2a, shows the interconnection of N processors to N memories via a multi-stage network.
Figure 2B:
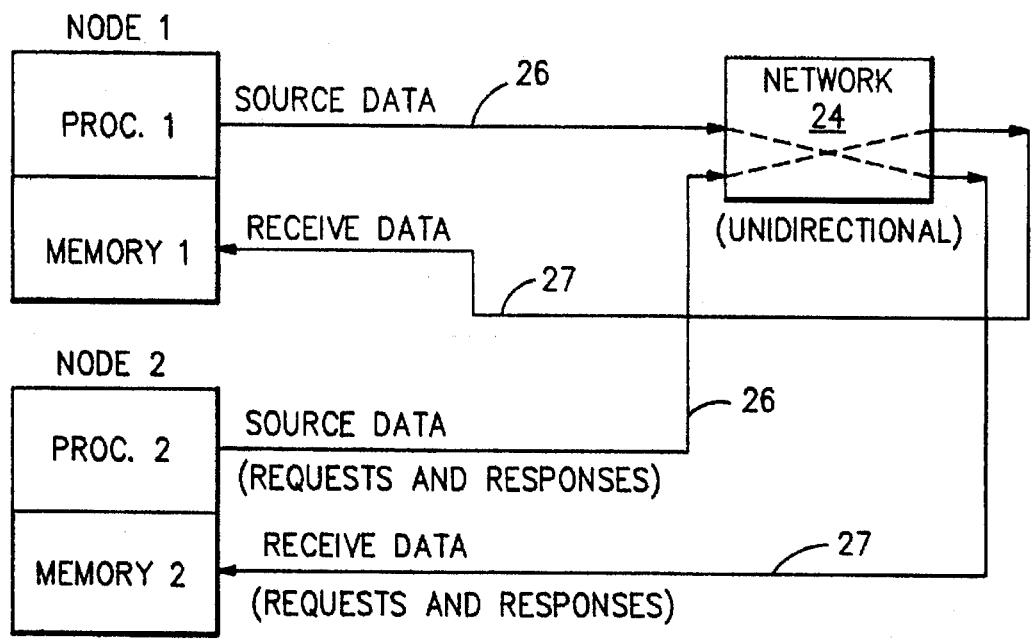
FIG. 2b shows a nodal embodiment for both a processor and memory; i.e., both processor and memory reside on the same side of the network.

The network itself is unidirectional and it is built from unidirectional 8×8 CROSSBAR SWITCHES. It is possible to accomplish two-way transfers using only a unidirectional network. To explain this, consider FIG. 2a, which shows the interconnection of N processors represented by the PROC 22 block to N memories represented by the MEMORY block 23 via a multi-stage network. Normally the processors are located on one side of the network, the memories on the other side, and a unidirectional network 24 in each direction is required for the two to communicate. However, modern parallel processors implement a nodal concept,.where a node contains both a processor and memory; i.e., both processor and memory reside on the same side of the network as shown in FIG. 2b. Thus, one unidirectional network 24 is sufficient to allow complete communication between all nodes. As shown in FIG. 2b, each node, NODE 1 and NODE 2 being representative of N nodes, has two interfaces to the unidirectional network, one interface 26 to source data to the network and one interface 27 to receive data from the network 24. In turn, the source data leaving any node can come from two sources: 1) REQUEST—a processor can be requesting a memory access from another node, or 2) RESPONSE—the memory can be responding to an access request from another node. The node, therefore, has to time-multiplex these two functions on to the one set of source interface lines to the network in a standard multiplexing manner, familiar to those skilled in the art. Likewise, data destined for any node and arriving over the single receive connection can be routed to either of two places: 1) MEMORY—another node can be requesting a memory access from this node, or 2) PROCESSOR—another node can be returning a memory access requested by the processor.

In summary of the above conclusions, it is entirely feasible to support two-way communication between all nodes using only a single unidirectional network. There are two types of data traversing the network: the sending of REQUESTS and RESPONSES to other nodes and the receiving of REQUESTS or RESPONSES from other nodes. It is this type of network that is most efficient and flexible; therefore, it is the basic network which is expanded by this disclosure to incorporate multiple functions.

Figure 3A:
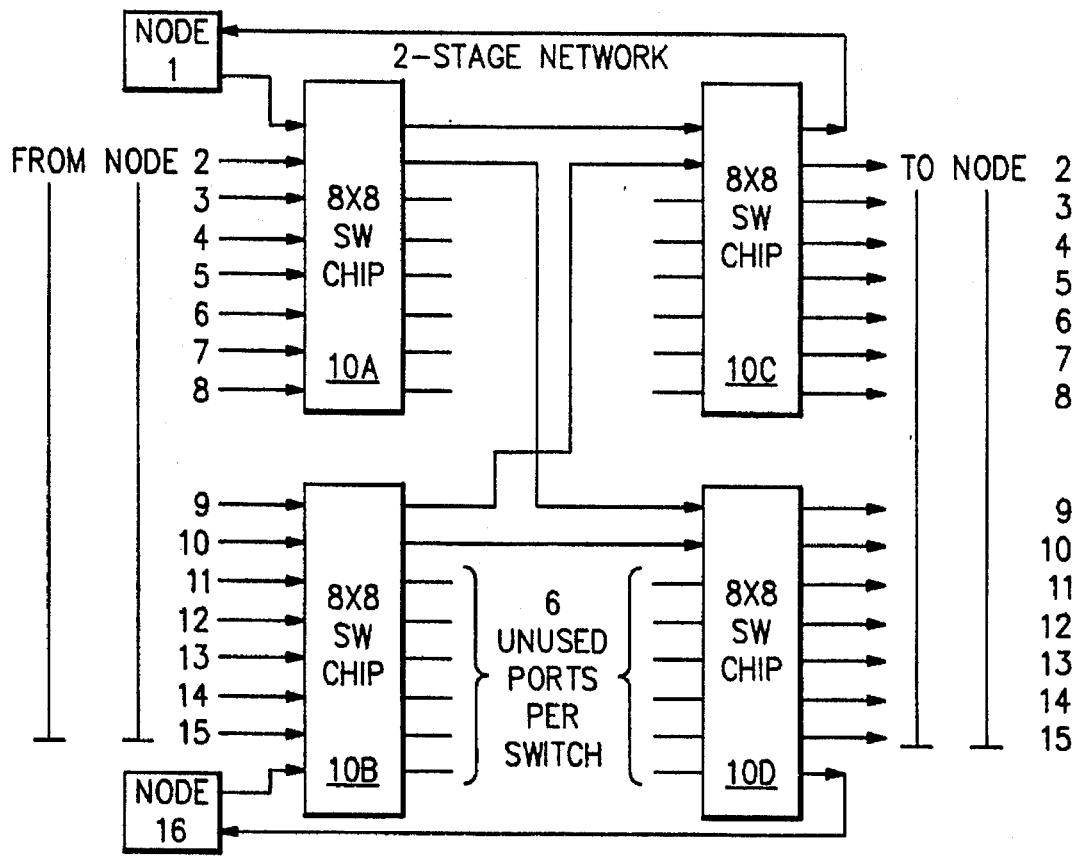
FIG. 3a shows the interconnection of 16 nodes using one MULTI-FUNCTION NETWORK composed of four 8×8 crossbar switch chips.
Figure 3B:
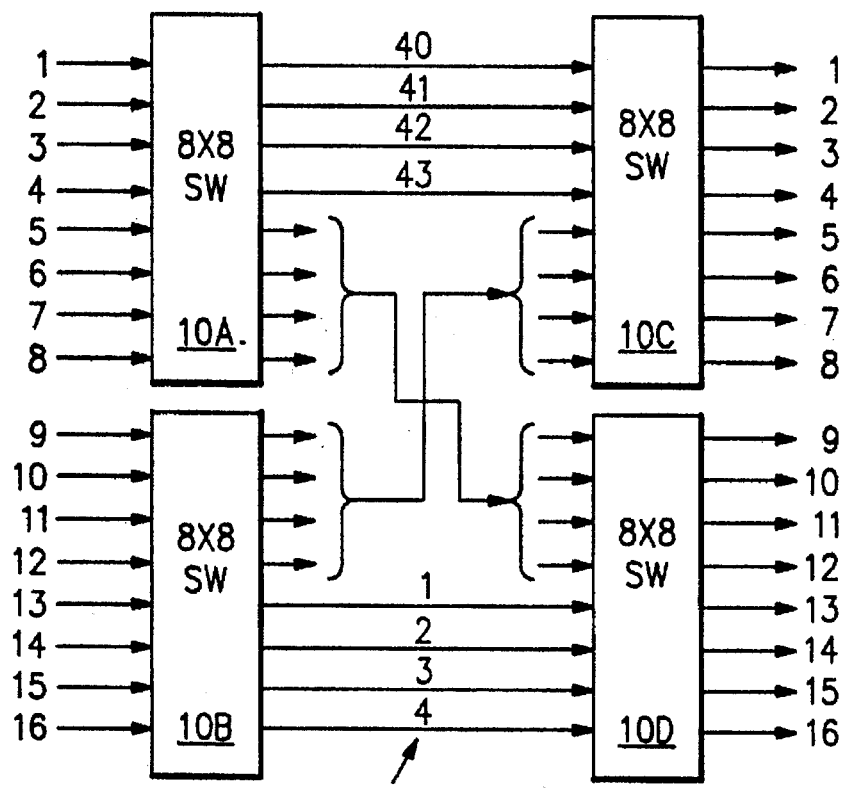
FIG. 3b shows alternate paths which can be established by connecting the previously unused ports.

FIG. 3a shows the interconnection of 16 nodes (with NODE 1–NODE 16 representing the connection) using one MULTI-FUNCTION NETWORK composed of four 8×8 crossbar switch 10 functional blocks. It shows that the 16 nodes can be completely interconnected by only partially using the available crossbar switch output ports; i.e., the right side of each of the two 8×8 switches 10A and 10B that receive the unidirectional inputs from the 16 nodes makes only two valid connections to the left side of each of the two 8×8 switches 10C and 10D that send unidirectional outputs to the 16 nodes. This leaves 6 unused output ports on each of the two 8×8 switches 10 that receive the unidirectional inputs from the 16 nodes, and 6 unused input ports on each of the two 8×8 switches 10 that send unidirectional outputs to the 16 nodes, as shown in FIG. 3a. The said interconnection scheme provides one and only one unique path between any two nodes (no Alternate Paths exist). However, Alternate Paths can be established as shown in FIG. 3b by connecting the six previously unused ports 6 in the manner demonstrated. Now there are four Alternate Paths 40, 41, 42, and 43 whereby any node can be connected to any other node. For instance, node 1 can be connected to send unidirectional REQUESTS or RESPONSES to node 7 equally well over any of 4 different network connections—path 40, 41, 42, or 43.

Figure 4A:
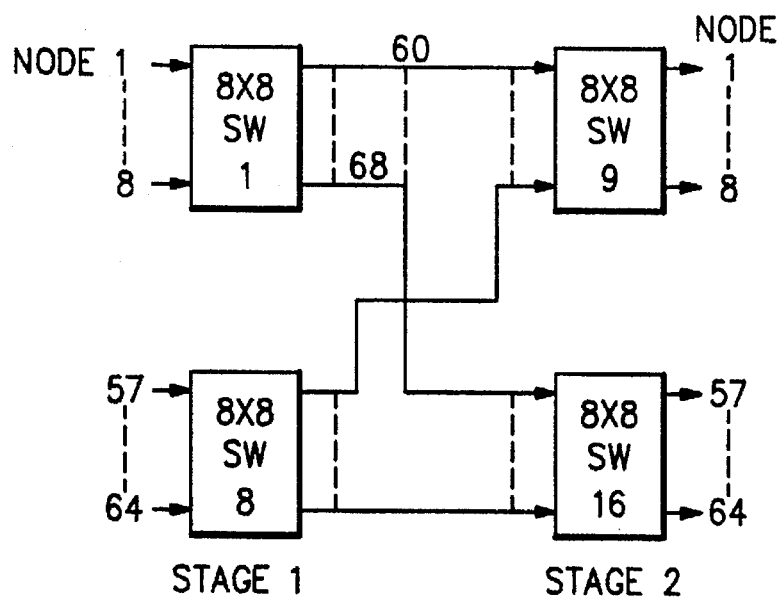
FIG. 4a shows a 64 node network built from 2 stages which has only 1 unique path between nodes and doesn't have any additional paths; and, FIG. 4b shows that by adding a stage and going to a 3-stage network as applied to a 32 node system, 8 alternate paths would exist between any two nodes.
Figure 4B:
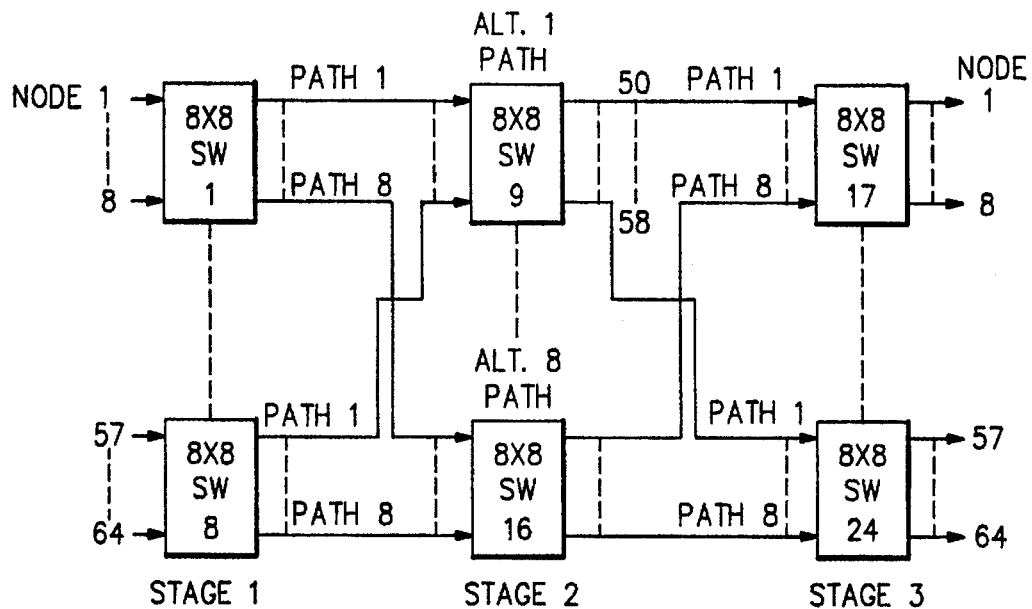

The Alternate Path concept can be applied to any number of nodes. For instance, FIG. 4a shows how a 64 node network built from two stages which has only 1 unique path 60 to 68 between nodes and doesn't have any additional paths can be modified to introduce alternate paths into the network. FIG. 4b shows that by adding a stage and going to a 3-stage network, that the network can be expanded to implement 8 alternate paths.

The disclosed network applies to multistage networks which implement Alternate Paths and which use these Alternate Paths to circumvent network blockage through rearrangeability. The device sending data into the network selects an Alternate Path either randomly or by the preferred embodiment based on the low order address bits of the node being accessed via the network. The sending node tries to establish a connection to the receiving node over the Alternate Path selected. If that path is blocked, it receives back a REJECT indication. It then rearranges its path selection decision and selects a different Alternate Path. The subsequent selection is made either randomly or by the preferred embodiment method of storing the low order address bits of the node being addressed in a binary counter, incrementing the counter by +1 every time a REJECT indication is received, and then retrying the connection over the newly selected Alternate Path as defined by the binary counter. This rearranging can continue indefinitely as the counter will loop on itself, thus retrying the Alternate Paths in succession or at random until blockage is successfully circumvented. Note, that a network implementing four Alternate Paths, as shown in FIG. 3b, would initially select a path based upon the two low order address bits of the addressed node and then store these two bits in a two-bit counter for rearrangeability incrementing. it is recognized that Heidelberger and Franazek reported in "Traffic Studies of Unbuffered Delta NetWorks" (RC 14103 (#63219), Computer Science, Oct. 17, 1988 and IBM Technical Journal, January, 1991) that their simulations have shown that two types of network traffic exist "Hot" and "Cold". "Cold" being random traffic and "Hot" being concentrated traffic to one particular node. The said studies have shown that "Cold" traffic gets through the network with a very high rate of probability on one of the first several tries at rearrangeability. However, this is not true for "Hot" traffic which becomes less likely to be successfully delivered with each successive retry and tends to clog the network. Therefore, the present disclosed rearrangeability method can be efficiently applied to "Cold" traffic in an unbuffered network, but something additional is required to handle "Hot" traffic.

The solution to the "Hot" traffic problem is to confine the "Hot" traffic to a specific Alternate Path and thus keep it from affecting the "Cold" traffic being transmitted over the other Alternate Paths. In addition, a method is required to handle the "Hot" traffic in an orderly and efficient manner so that it is processed as quickly as possible and in a manner that prevents the "starvation" of any particular node (the blocking of a particular node or nodes from ever getting a connection to a node that is experiencing "Hot" traffic). The approach which provides the required orderly servicing of "Hot" traffic and the prevention of starvation is called "Guaranteed Delivery" or "High Priority Mode" as disclosed in "A Dual Priority Scheme for Simplex Networks" by H. T. Olnowich, et al; U.S. Ser. No. 07/800,652, filed Nov. 27, 1991 U.S. Pat. No. 5,444,705. The said disclosure defines a second level of network interconnectivity as a high priority mode of network operation which reserves partial paths for a "Hot" transmissions up to the point of blockage. In this High Priority mode the blocked stage is then won for the halted "Hot" traffic as soon as the blocked stage becomes available. The transmitter is informed of the removal of the blockage and a retry occurs at the earliest instant of time and only when it is guaranteed to get through the previously blocked stage.

Thus the, overall rearrangeability method implemented by the disclosed MULTI-FUNCTION NETWORK handles both "Hot" and "Cold" traffic efficiently is as follows:

1) The first several tries assume that the traffic is "Cold" and establish a first connection through the network based on either a random selection of an Alternate Path or the low order address bits of the node which is receiving the message, as described above. If the Alternate Path selected first has no blockages, the connection is successful and the "Cold traffic" is sent successfully. However, if the first Alternate Path has blockage, the Multi-function Network rejects the connection. A second Alternate path is selected automatically by the hardware either randomly or by incrementing the low order address bits of the receiving node address, as described above. Subsequent, retries can be made in a similar manner until one is successful, the connection is established, and the network transfer is made. In general, the finding of a non-blocked path and subsequent successful message transmission through the Multi-Function Network will occur for all "Cold" traffic.

2) A means is required to detect "Hot" traffic and to then change the mode of transmission over the Multi-Function Network to a second and more efficient mode for the handling of "Hot" traffic. A rearrangeability retry counter is maintained to count the number of times a message is tried over the network (the number a times an Alternate Path selection is made). A programmable threshold is placed on this retry counter, such that after the number of tries defined by the threshold is surpassed, the traffic is reclassified as being "Hot" traffic. For example, assume that the retry threshold is set for a total of 3 tries at establishing a connection through the said network as "Cold" traffic. Then, after the third unsuccessful try, the message is reclassified as "Hot" traffic and a new method of delivery through the MULTI-Function Network is brought into effect or the counter can be allowed to continue by looping back on itself as mentioned previously. The rearrangeability ("Cold") method of delivery is replaced with the "Guaranteed Delivery" ("Hot") method.

3) "Guaranteed Delivery" can be accomplished by either of two methods: a) selecting one or several unique Alternate Paths which are to receive all "Hot" traffic and no "Cold" traffic, or b) mixing "Hot" and "Cold" traffic on the same Alternate Paths by selecting the "Hot" path on the basis of the low order node address bits (the same bits that defined the first path to be tried under the rearrangeability method). The later is the preferred embodiment that is described for the present invention. For the later and preferred method, the path selected for "Hot" traffic is forced into the Guaranteed Delivery Mode of operation. The advantage of the preferred approach is that since the "Hot" Alternate Path selection is based on the node address, all traffic to that "Hot" node will be forced onto the same Alternate Path regardless of how many nodes are requesting to send messages to that node. This frees up all the remaining Alternate Paths to be used for "Cold" traffic and confines blockage due to "Hot" traffic to one "Hot" Alternate Path (although it is possible for several or many nodes experiencing "Hot" traffic at the same time to cause several or many Alternate Paths to be operating in the "Hot" mode simultaneously—there is no restriction as to how many Alternate Paths can be operating in "Hot" or "Cold" mode simultaneously). Multiple "Hot" spots could require the dedication of more than one Alternate Path, if the low order node address bits are different for different hot spots, but the approach would still handle multiple "Hot" spots efficiently. In addition, it is possible for some "Cold" traffic during normal rearranging to attempt to use the "Hot" Alternate Path, but it will be rejected and via continued rearrangeability go on to find a "Cold" Alternate Path where it does get through the network successfully.

Another, advantage of the preferred approach is that all Alternate Paths are available to handle "Cold" traffic for the normal case of random traffic only—when no "Hot" traffic exists. Thus for the normal case, the Alternate Paths are all usable to provide increased network bandwidth.

Figure 5:
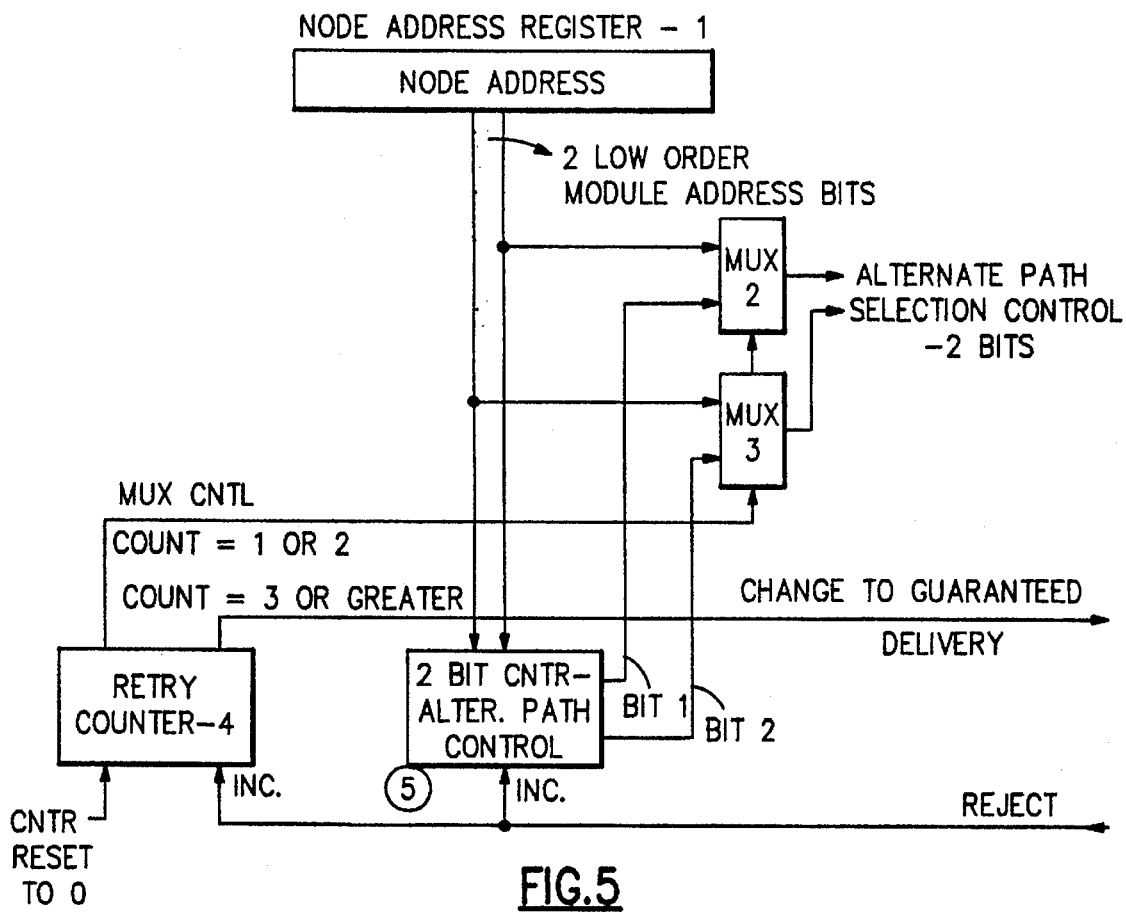
FIG. 5 shows the simple hardware implementation of rearrangeability, hot spot detection, and changing over to Guaranteed Delivery mode.

FIG. 5 shows the simple hardware implementation of rearrangeability, hot spot detection, and changing over to Guaranteed Delivery mode included in each node coupled to the network. FIG. 5 shows the hardware which permits the finding an unblocked path through a multi-stage network and the circumventing of "Hot" spots in network traffic using a method which is performed automatically and transparently in relation to the software. The implementation shown is for the control of four Alternate Paths and the hardware only requires two 1-bit muxes (MUX-2 and MUX-3) and two counters (Retry Counter-4 and Alternate Path Control Counter 5). The two mux's (multiplexers) provide an output of two encoded bits which define which of the four Alternate Paths is to be selected at any given time. The mux's 2 and 3 are controlled from the Retry Counter-4 which is reset to 0 at the beginning of every new message. Both counters 4 and 5 are incremented based on the REJECT signal indicating that the path that was tried was blocked and a subsequent REJECT indication was issued. When the Retry Counter-4 contains a count of 0, 1, or 2, the mux control is selected to take the Alternate Path number from the output of counter-5 which causes rearrangeability to occur. For all other values of the Retry Counter-4, the mux control is selected to take the Alternate Path number from the low order address bits of the receiving node address as stored in Node Address Register 1. Thus for the very first try and for Guaranteed Delivery, the Alternate Path number comes from the low order bits of the Node Address Register 1. When the Retry Counter-4 contains a count of 3 or more, "Hot" traffic detection is made and the Guaranteed Delivery mode is forced by the hardware. Control counter 5 is loaded from the low order bits of Node Address Register 1 during the first try is increment by each rejection.

The Alternate Path approach also provides better fault tolerance compared to single path systems because many component or wiring failures will only take out 1 or several of the Alternate Paths and still leave some usable paths.

For cases where better fault tolerance or network bandwidth is required, it is possible to implement multiple copies of the simplex network described above—with each copy implementing its unique set of Alternate Paths.

Clearly, while we have disclosed our preferred embodiments and best mode of practicing our inventions, they can be the basis for much growth in performance of network systems. Those skilled in the art, both now and in the future, will envision further improvements, features and enhancements, even by way of further invention, without departing from the scope of the following claims which should be construed to protect and maintain the proper scope of our inventions in light of other prior developments.

What is claimed is:

1. A multi-stage bufferless switching network, the network comprising:

a plurality of bufferless switching apparatuses cascaded into stages, each said switching apparatus including a plurality of switch inputs and a plurality of switch outputs, each of said switch outputs coupled to a switch input of another of said switching apparatuses, the switch outputs of last stage switching apparatuses each coupled to a switch input of a first stage switching apparatus through one of a plurality of nodes, the switch outputs of last stage switching apparatuses comprising network output ports and the switch inputs of first stage switching apparatuses comprising network input ports;

the switching apparatuses each including:

means for establishing a plurality of direct connections, a direct connection connecting any one of the network input ports to any one of the network output ports, in response to connection requests received at a plurality of the network input ports, for transmitting data from said plurality of the network input ports to a plurality of the network output ports, the direct connection comprising one of a plurality of pathways connectable from said any one of the network input ports to said any one of the network output ports; and detecting means coupled to each switch output for detecting a blocked switch output in the pathway of the direct connection; and each of the nodes including:

rearrangeability means coupled to a connected network input port for sending a connection request to the connected network input port for an alternate direct connection between said any one of the network input ports and said any one of the network output ports in response to said detecting means detecting the blocked switch output.

2. The network according to claim 1, wherein each of said nodes further include one or more network devices, thereby allowing each of the network devices to transmit data to any other of the network devices via one network input port and one network output port.

3. The network according to claim 1, wherein the rearrangeability means includes:

address register that stores at least part of an address of a targeted node;

multiplexor means, operably coupled to the address register, for providing an alternate path selection based on the at least part of the address of the targeted node or based on an updated address;

a first counter that provides a control signal for determining whether the multiplexor means will provide the alternate path selection based on the at least part of the address of the targeted node or based on an updated address; and a second counter operably coupled to the multiplexor means, wherein the second counter provides the updated address.

4. The network according to claim 1 wherein said means for establishing a plurality of direct connections establishes said direct connections simultaneously and asynchronously in relation to a plurality of connection requests received separately at a plurality of the network input ports.

* * * * *

UNITED STATES PATENT AND TRADEMARK OFFICE
CERTIFICATE OF CORRECTION

PATENT NO. : 5,654,695

DATED : August 5, 1997

INVENTOR(S) : HOWARD T. OLNOWICH et al

It is certified that error appears in the above-indentified patent and that said Letters Patent is hereby corrected as shown below:

Col. 1, line 38  Delete "me" and replace with "the"

Signed and Sealed this

Ninth Day of December, 1997

Attest:

BRUCE LEHMAN

*Attesting Officer*  *Commissioner of Patents and Trademarks*